(12) United States Patent
Hellman et al.

(10) Patent No.: US 11,965,915 B2
(45) Date of Patent: Apr. 23, 2024

(54) GROUND TUNING SWITCH

(71) Applicant: SensePeek AB, Vellinge (SE)

(72) Inventors: Johan Hellman, Trelleborg (SE); Magnus Birch, Svedala (SE); Magnus Sjöberg, Lomma (SE)

(73) Assignee: SensePeek AB, Vellinge (SE)

( * ) Notice: Subject to any disclaimer, the term of this patent is extended or adjusted under 35 U.S.C. 154(b) by 0 days.

(21) Appl. No.: 18/057,634

(22) Filed: Nov. 21, 2022

(65) Prior Publication Data
US 2023/0168285 A1 Jun. 1, 2023

(30) Foreign Application Priority Data
Nov. 26, 2021 (EP) ..................................... 21210861

(51) Int. Cl.
*G01R 27/28* (2006.01)
*G01R 19/00* (2006.01)

(52) U.S. Cl.
CPC ................................ *G01R 19/0053* (2013.01)

(58) Field of Classification Search
CPC ............ G01R 1/06766; G01R 1/06772; G01R 1/06788; G01R 19/0053
See application file for complete search history.

(56) References Cited

U.S. PATENT DOCUMENTS

| | | | | |
|---|---|---|---|---|
| 4,923,407 A | * | 5/1990 | Rice .................. | G01R 1/06788 439/98 |
| 5,293,122 A | | 3/1994 | Cake et al. | |
| 6,307,363 B1 | * | 10/2001 | Anderson .......... | G01R 1/06772 324/149 |
| 7,518,385 B2 | * | 4/2009 | Convers ............ | G01R 1/06772 324/754.03 |
| 2007/0227876 A1 | * | 10/2007 | Shamoun ................ | H01J 37/34 204/192.1 |
| 2008/0001611 A1 | | 1/2008 | Convers | |
| 2008/0309356 A1 | * | 12/2008 | Yang .................. | G01R 1/06788 324/756.04 |
| 2011/0025429 A1 | * | 2/2011 | Syal ....................... | H01P 3/081 333/34 |
| 2011/0074389 A1 | | 3/2011 | Knierim et al. | |

(Continued)

FOREIGN PATENT DOCUMENTS

EP 3477308 5/2019

OTHER PUBLICATIONS

Extended European Search Report for EP21210861, dated May 24, 2022 in 6 pages.

*Primary Examiner* — Thang X Le
(74) *Attorney, Agent, or Firm* — Knobbe, Martens, Olson & Bear, LLP

(57) ABSTRACT

Herein is provided a device for optimizing bandwidth during oscilloscope measurements. The device is connectable to a probe for electrically connecting a test point and an oscilloscope. The device may include at least two grounding connectors with different inductances for electrically connecting ground to the probe and a tuning network comprising circuitry configured to compensate for the different inductances of said at least two grounding connectors, the tuning network being switchable between different modes, each mode being configured to compensate for a specific inductance of said at least two grounding connectors. A method for optimizing bandwidth during oscilloscope measurements is also provided.

13 Claims, 3 Drawing Sheets

(56) References Cited

U.S. PATENT DOCUMENTS

| | | |
|---|---|---|
| 2013/0134999 A1 | 5/2013 | Bartlett et al. |
| 2014/0103951 A1* | 4/2014 | Knierim ................. G01R 31/50 |
| | | 702/58 |
| 2019/0120876 A1* | 4/2019 | Cosman ............. G01R 1/07314 |
| 2020/0099117 A1 | 3/2020 | Lujan et al. |

* cited by examiner

GROUND TUNING SWITCH

TECHNICAL FIELD

The present inventive concept relates to optimizing bandwidth during oscilloscope measurements. In particular, the present inventive concept relates to a device and method for compensating for different inductances.

BACKGROUND

In the prior art, when doing oscilloscope measurements, it is common to use different grounding connectors depending on the measurement frequency. A relatively longer grounding connector is used for measurements below circa 10 MHz. This longer grounding connector is simple to use and is usually connected to the oscilloscope itself. However, a relatively shorter grounding connector is used for measurements over circa 10 MHz because the inductance of the longer cable of the grounding connector will interfere with such high-frequency measurements. This shorter grounding connector is usually connected closer to a probe used for electrically connecting a test point and the oscilloscope, e.g. as a split in the cable.

Oscilloscopes are usually tuned to achieve a high bandwidth when using the shorter grounding connector, however this reduces the bandwidth when using the longer grounding connector and makes this impractical to use.

SUMMARY

An objective of the present inventive concept is to improve the experience of using the longer grounding connector and to further facilitate using several different grounding connectors with different inductance values.

The inventors have realized that it is not sufficient to tune the oscilloscope to achieve a high bandwidth when using the longer grounding connector, as while this may allow for using the longer grounding connector at frequencies much higher than 10 MHz, a well-tuned shorter grounding connector will still have the highest bandwidth for very high frequencies.

According to an aspect of the present inventive concept there is provided a device for optimizing bandwidth during oscilloscope measurements. The device is connectable to a probe for electrically connecting a test point and an oscilloscope. The device comprises at least two grounding connectors with different inductances for electrically connecting ground to the probe; and a tuning network comprising circuitry configured to compensate for the different inductances of said at least two grounding connectors, the tuning network being switchable between different modes, each mode being configured to compensate for a specific inductance of said at least two grounding connectors.

A device according to this aspect enables using any number of different grounding connectors with optimized bandwidth. For example, a relatively long grounding connector may be used when a shorter grounding connector does not reach, while still having an optimized bandwidth.

The test point may e.g. be a part of a circuit board that is to be measured using the oscilloscope.

According to one embodiment, the tuning network comprises at least one tunable capacitive element and a switch for electrically connecting the probe to one of at least two sets of compensation circuitry with different electrical properties, each compensation circuitry being configured to compensate for a specific inductance of said at least two grounding connectors.

Such a tuning network is simple and fast to switch between different modes.

The compensation circuitry with different electrical properties may e.g. be several sets of parallel-coupled resistors and capacitors with different values for the resistance and capacitance, respectively. Alternatively, the compensation circuitry may comprise a coil or amplifier.

The compensation circuitry enables a flat frequency response to be achieved for each of the different grounding connectors.

According to one embodiment, the device further comprises a mechanical switch for controlling the mode of the tuning network.

Such a mechanical switch is simple and efficient to use.

According to one embodiment, the probe is electrically passive.

Passive probes have a wide dynamic range and are well-suited for low frequency signals.

According to one embodiment, said at least two grounding connectors are alternatingly electrically connectable to the probe.

This enables a user to choose the grounding connector best suited for the measurement. Connecting the different grounding connectors to the probe enables the connection point to be as close as possible to the test point and is also simple to find and use.

According to one embodiment, the probe further comprises a mechanical connection point that one of said at least two grounding connectors is mechanically connectable to.

Such a mechanical connection point is simple, robust and efficient to use.

According to one embodiment, a cable electrically connecting the probe and the oscilloscope further comprises a mechanical connection point that one of said at least two grounding connectors is mechanically connectable to.

This enables a user to choose the mechanical connection point best suited for the measurement.

According to one embodiment, the mechanical connection point is a female-type contact and each of said at least two grounding connectors comprises a male-type contact.

Male-female type contacts are especially well-suited for fast and simple connection and disconnection while still forming a robust connection.

In alternative embodiments, the mechanical connection point is a male-type contact and each of said at least two grounding connectors comprises a female-type contact.

As an example, the male-female type contacts may be DuPont contacts.

According to one embodiment, said at least two grounding connectors have a different cable length.

Different cable lengths may cause different inductances.

According to one embodiment, the tuning network is integrated in the probe.

This enables the tuning network to be as close as possible to the test point and is also simple to install.

According to one embodiment, the probe is hands-free.

A hands-free probe may e.g. include stabilizers for standing upright without being held, having a spring-loaded probe tip or in general be suitable for a hands-free circuit board.

According to one embodiment, one of said at least two grounding connectors with different inductances for electrically connecting ground to the probe is a spring directly connectable to the probe.

Such a spring may provide suitable tactile feedback for the user or a suitable force equilibrium between the spring and the weight of the probe in the case of a hands-free probe. The spring further enables the grounding point to be as close as possible to the test point.

According to another aspect of the present inventive concept, a method for optimizing bandwidth during oscilloscope measurements is provided. The method comprises: electrically connecting a test point and an oscilloscope using a probe; electrically connecting ground to the probe using one of at least two grounding connectors with different inductances; switching a tuning network between different modes, each mode being configured to compensate for a specific inductance of said at least two grounding connectors; and compensating for the different inductances of said at least two grounding connectors using the tuning network.

This aspect may generally present the same or corresponding advantages as the former aspect.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
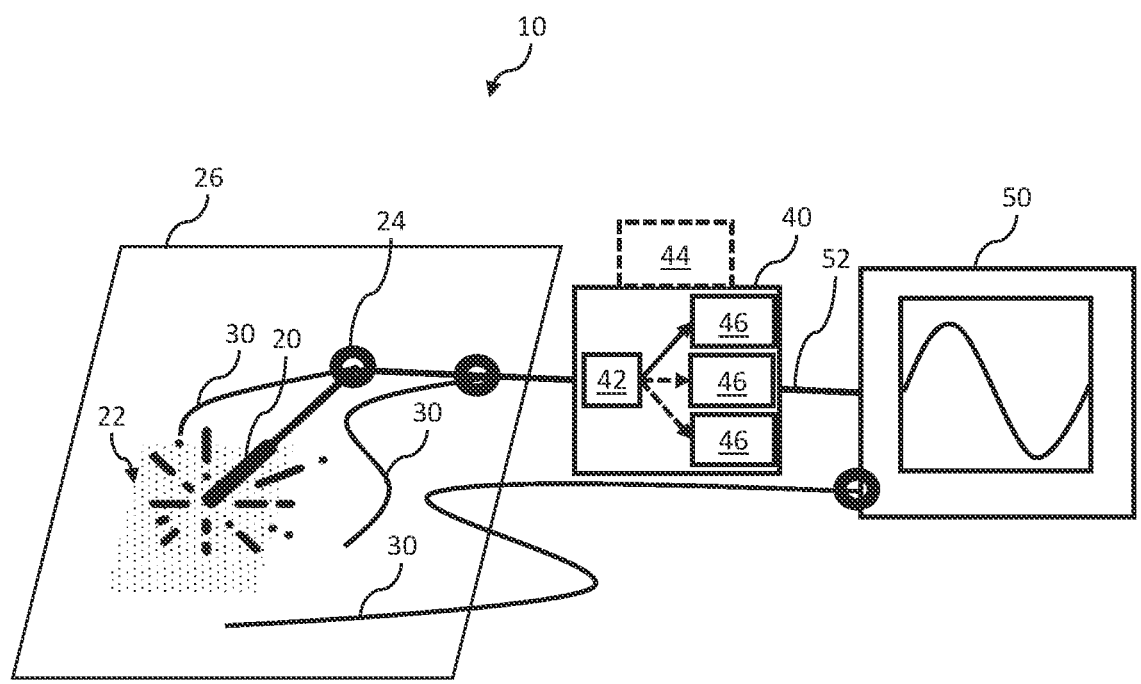
FIG. 1 is a schematic illustration of a device according to an embodiment.

FIG. 1 illustrates a measuring setup comprising a device 10 for optimizing bandwidth during oscilloscope measurements. The device 10 is connectable to a probe 20 for electrically connecting a test point 22 and an oscilloscope 50.

The probe 20 may be electrically active or passive. The probe 20 may be configured to be operated hands-free. A hands-free probe 20 may e.g. include stabilizers for standing upright without being held, having a spring-loaded probe tip or in general be suitable for a hands-free circuit board 26.

The test point 22 may be a part of a circuit board 26 or any other electrical component that a user wants to measure using the oscilloscope 50.

The device 10 comprises three grounding connectors 30 for electrically connecting ground to the probe 20. The circuit board 26 may comprise specific ground points, however the grounding connectors 30 may connect to any ground.

The device 10 may comprise two or more grounding connectors 30. Each grounding connector 30 has a different inductance, partly because of their different cable lengths. For example, one grounding connector 30 may have no cable and instead be formed integral with or directly connectable to the probe 20.

One of the grounding connectors 30 may be a spring directly connectable to the probe 20. Such a spring is electrically conductive and enables a good contact with the ground, also even if the probe 20 is operated hands-free.

The different grounding connectors 30 are connectable to different connection points 24 of the measuring setup, either the probe 20, the oscilloscope 50, or a cable 52 electrically connecting the probe 20 and the oscilloscope 50. Each grounding connector 30 may be configured to be alternatingly electrically connectable to each of the different parts of the measuring setup.

The connection points 24 electrically connect a grounding connector 30 to the measuring setup, in particular the probe 20 to determine a reference ground for the measured voltage of the test point 22.

The connection points 24 may further be mechanical connection points 24, i.e. for holding the grounding connector 30 in place to maintain the connection more easily. The connection points 24 of the measuring setup may e.g. be of a female-type contact and the grounding connectors 30 may comprise corresponding male-type contacts. Alternatively, the connection points 24 of the measuring setup may e.g. be of a male-type contact and the grounding connectors 30 may comprise corresponding female-type contacts.

Such male/female type contacts may e.g. be crocodile clamps or DuPont-type contacts.

While FIG. 1 shows all three grounding connectors 30 in use at the same time, the device 10 may be configured to assume or allow only one grounding connector 30 in use at the same time. Accordingly, the grounding connectors 30 are alternatingly electrically connectable to the probe 20.

For example, the measuring setup may only comprise a single connection point 24, which is configured to only connect to a single grounding connector 30 at a time. Alternatively, while several connection points 24 may exist, only a single one is configured to be functional at a time.

The device 10 further comprises a tuning network 40. The tuning network 40 comprises circuitry configured to compensate for the different inductances of the grounding connectors 30. The tuning network 40 is switchable between different modes 46, each mode 46 being configured to compensate for a specific inductance of each grounding connector 30.

The tuning network 40 may for example comprise three sets of compensation circuitries connected in parallel, each set corresponding to a mode 46 of the tuning network 40 and being configured to compensate for a different inductance of the three grounding connectors 30. The tuning network 40 may comprise a tunable capacitive element to match electrical properties of the oscilloscope 50.

Each compensation circuitry has different electrical properties and is configured to compensate for a specific inductance of each grounding connector 30.

The tuning network 40 may further comprise a switch 42 for electrically connecting the probe 20 to one of the three modes 46.

The tuning network 40 may thereby be configured to compensate for each of the different inductances of the three grounding connectors 30, depending on the mode 46 of the tuning network 40, the mode 46 being controlled by the switch 42.

The mode 46 may be controllable by a processor in communication with the tuning network. The mode 46 may be controllable by a user, e.g. using a mechanical switch 44 connected to the switch 42 of the tuning network 40. In FIG. 1, the tuning network 40 is shown schematically as being between the probe 20 and the oscilloscope 50. In alternative embodiments, the tuning network 40 may be integrated in the probe 20 or the oscilloscope 50.

Figure 2:
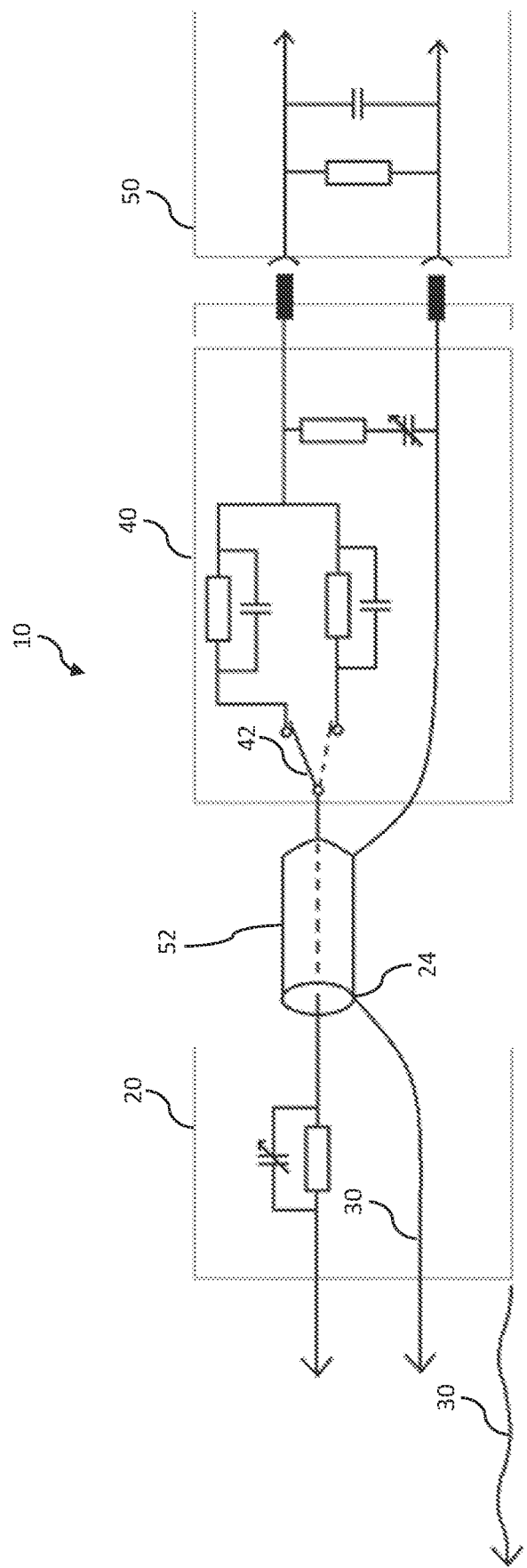
FIG. 2 is a schematic illustration of a device according to an embodiment.

FIG. 2 illustrates another measuring setup comprising a device 10 similar to the device of FIG. 1. Compared to FIG. 1, the device 10 of FIG. 1 comprises two grounding connectors 30 and discloses more details regarding the circuitry.

In FIG. 2, the probe 20 may e.g. be a passive 10:1 probe with 9:1 ratio of resistance between the resistive element in the probe 20 and the resistive element in the oscilloscope 50. For example, the resistive element in the probe 20 may have a resistance of 450 Ohm and the resistive element in the oscilloscope 50 may have a resistance of 50 Ohm. As another example, the resistive element in the probe 20 may have a resistance of 9 MOhm and the resistive element in the oscilloscope 50 may have a resistance of 1 MOhm. Accordingly, an input of 1 Volt from the testing point yields a 0.1 Volt output to the oscilloscope 50. Other probes may be used in a similar manner, such as a 1:1 or 1:20 probe.

The two grounding connectors 30 shown in FIG. 2 are a short grounding connector 30 and a long grounding connector 30. The short grounding connector 30 has a cable length of 0-10 mm, e.g. 5 mm and the long grounding connector 30 has a cable length of 5-10 cm, e.g. 7 cm.

The tuning network 40 in FIG. 2 comprises two sets of a capacitive element and a resistive element connected in parallel, each set being connected in parallel. The tuning network 40 further comprises a switch 42 for electrically connecting the probe 20 to one of the two sets. Accordingly, the probe 20 only senses a single set. Each set is configured to compensate for a specific inductance of the one of the two grounding connectors 30, e.g. by controlling the tunable capacitive elements.

By controlling the switch 42, a set may be chosen that compensates for the specific grounding connector 30 that is connected to the probe 20. Thereby, the tuning network 40 may compensate for the different inductances of the two grounding connectors 30 to optimize bandwidth during measurements.

This is merely one example of several different possible circuitries for the tuning network to be configured to compensate for the different inductances of the two grounding connectors.

The tuning network 40 in FIG. 2 further comprises compensation adjustment circuitry, being set of a resistive element and a tunable capacitive element. In the example of FIG. 2, the probe 20 also comprises such compensation adjustment circuitry.

These compensation adjustment circuitries may be used to match the capacitance of the device 10 to the input capacitance of the oscilloscope 50.

Figure 3:
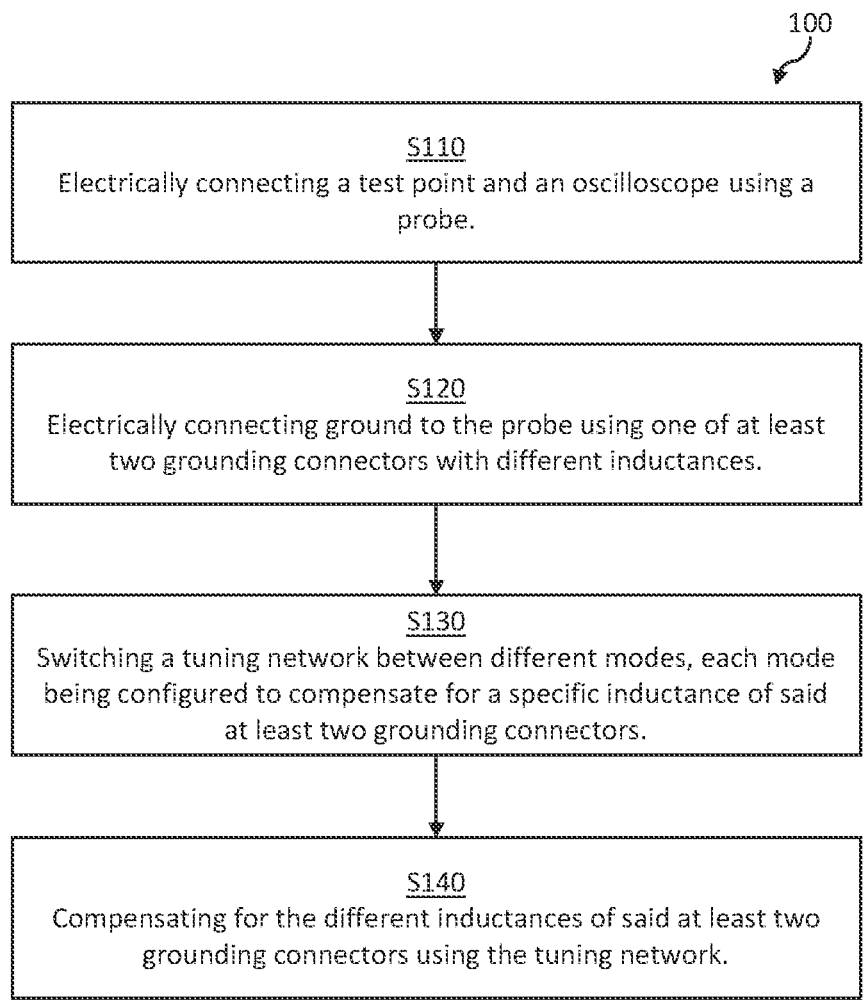
FIG. 3 is a flowchart showing method steps according to an embodiment.

FIG. 3 illustrates a flowchart exemplifying a method 100 for optimizing bandwidth during oscilloscope measurements. The method 100 comprises four steps S110-S140, though other steps are also possible and the steps may be performed in any order and/or simultaneously.

The method 100 may be performed using the device of FIGS. 1-2 or any other suitable device.

The first step shown comprises electrically connecting S110 a test point and an oscilloscope. This step may be performed using an electrically active or passive probe and with a hands-free probe or not.

The second step shown comprises electrically connecting S120 ground to the probe. This step is performed using one of at least two grounding connectors with different inductances.

The third step shown comprises switching S130 a tuning network between different modes. Each mode is configured to compensate for a specific inductance of said at least two grounding connectors. This step may be performed by controlling a switch, e.g. using a mechanical switch or a processor.

The last step shown comprises compensating S140 for the different inductances of said at least two grounding connectors. This step is performed using the tuning network.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A device for optimizing bandwidth during oscilloscope measurements, the device being connectable to a probe for electrically connecting a test point and an oscilloscope, and the device comprising:
   at least two grounding connectors with different inductances for electrically connecting ground to the probe; and
   a tuning network comprising circuitry configured to compensate for the different inductances of said at least two grounding connectors, the tuning network being switchable between different modes, each mode being configured to compensate for a specific inductance of said at least two grounding connectors.

2. The device according to claim 1, wherein the tuning network comprises at least one tunable capacitive element and a switch for electrically connecting the probe to one of at least two sets of compensation circuitry with different electrical properties, each compensation circuitry being configured to compensate for a specific inductance of said at least two grounding connectors.

3. The device according to claim 1, further comprising a mechanical switch for controlling the modes of the tuning network.

4. The device according to claim 1, wherein the probe is electrically passive.

5. The device according to claim 1, wherein said at least two grounding connectors are alternatingly electrically connectable to the probe.

6. The device according to claim 1, wherein the probe further comprises a mechanical connection point that one of said at least two grounding connectors is mechanically connectable to.

7. The device according to claim 1, wherein a cable electrically connecting the probe and the oscilloscope further comprises a mechanical connection point that one of said at least two grounding connectors is mechanically connectable to.

8. The device according to claim 6, wherein the mechanical connection point is a female-type contact and each of said at least two grounding connectors comprises a corresponding male-type contact.

9. The device according to claim 1, wherein said at least two grounding connectors have a different cable length.

10. The device according to claim 1, wherein the tuning network is integrated in the probe.

11. The device according to claim 1, wherein the probe is hands-free.

12. The device according to claim 1, wherein one of said at least two grounding connectors with different inductances for electrically connecting ground to the probe is a spring directly connectable to the probe.

13. A method for optimizing bandwidth during oscilloscope measurements, the method comprising:
   electrically connecting a test point and an oscilloscope using a probe;

electrically connecting ground to the probe using one of at least two grounding connectors with different inductances;

switching a tuning network between different modes, each mode being configured to compensate for a specific inductance of said at least two grounding connectors; and compensating for the different inductances of said at least two grounding connectors using the tuning network.

\* \* \* \* \*